(12) United States Patent
Kim et al.

(10) Patent No.: US 10,566,947 B2
(45) Date of Patent: Feb. 18, 2020

(54) FILTER FOR BOTH DIFFERENTIAL MODE AND COMMON MODE

(71) Applicant: AMOTECH CO., LTD., Incheon (KR)

(72) Inventors: Jong Soo Kim, Incheon (KR); Jae Su Ryu, Seoul (KR); Yoon Ho Hwang, Seoul (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/075,406

(22) PCT Filed: Feb. 3, 2017

(86) PCT No.: PCT/KR2017/001194
§ 371 (c)(1),
(2) Date: Aug. 3, 2018

(87) PCT Pub. No.: WO2017/135734
PCT Pub. Date: Aug. 10, 2017

(65) Prior Publication Data
US 2019/0044490 A1   Feb. 7, 2019

(30) Foreign Application Priority Data

Feb. 5, 2016   (KR) ........................ 10-2016-0015070

(51) Int. Cl.
*H03H 7/42*   (2006.01)
*H03H 7/01*   (2006.01)
*H03H 1/00*   (2006.01)

(52) U.S. Cl.
CPC .......... *H03H 7/427* (2013.01); *H03H 1/0007* (2013.01); *H03H 7/0115* (2013.01);
(Continued)

(58) Field of Classification Search
CPC ........... H03H 2001/0085; H03H 7/427; H03H 7/0115
(Continued)

(56) References Cited

U.S. PATENT DOCUMENTS 5,621,366 A * 4/1997 Gu .......................... H01P 7/084
                                                             333/185
2009/0128258 A1   5/2009 Xu et al.
(Continued)

FOREIGN PATENT DOCUMENTS

JP   2003-087074   3/2003
KR   10-0578296    5/2006
(Continued)

OTHER PUBLICATIONS

International Search Report and Written Opinion issued in International Patent Application No. PCT/KR2017/001194, dated Jun. 7, 2017.

*Primary Examiner* — Rakesh B Patel
(74) *Attorney, Agent, or Firm* — Norton Rose Fulbright US LLP

(57) ABSTRACT

A filter for both a differential mode and a common mode is provided. A filter for both a differential mode and a common mode according to an embodiment of the present invention comprises: a pair of series inductors having a plurality of coil patterns; two pairs of parallel capacitors connected to opposite ends of the pair of inductors, respectively; and a pair of series capacitors connected to the pair of inductors in parallel. Therefore, the filter can be used in both a common mode and a differential mode, and can remove noise without using an additional filter in an application having a comparatively high data processing speed.

16 Claims, 17 Drawing Sheets

(52) U.S. Cl.
CPC ............. *H03H 2001/0014* (2013.01); *H03H 2001/0085* (2013.01); *H03H 2007/013* (2013.01)

(58) Field of Classification Search
USPC .................................. 333/12, 175, 181, 185
See application file for complete search history.

(56) References Cited

U.S. PATENT DOCUMENTS

2014/0084791 A1    3/2014   Takahashi et al.
2016/0276997 A1*   9/2016   Teramoto ............... H03H 7/427

FOREIGN PATENT DOCUMENTS

| KR | 20090121337 | 11/2009 |
| KR | 20120070228 | 6/2012 |
| KR | 20140134938 | 11/2014 |
| KR | 101473740 | 12/2014 |

\* cited by examiner

US 10,566,947 B2

FILTER FOR BOTH DIFFERENTIAL MODE AND COMMON MODE

CROSS-REFERENCE TO RELATED APPLICATIONS

This application is a national phase application under 35 U.S.C. § 371 of International Application No. PCT/KR2017/001194, filed Feb. 3, 2017, which claims priority to and the benefit of Korean Patent Application No. 10-2016-0015070, filed Feb. 5, 2016. The contents of the referenced patent applications are incorporated into the present application by reference.

FIELD OF THE DISCLOSURE

The present invention relates to a differential mode filter, and more specifically, to a filter for both a differential mode and a common mode configured to remove a common mode noise and a noise multiplied from a differential line.

DESCRIPTION OF RELATED ART

Recently, every electronic device has a processing speed which has become fast due to an increase in processing data. Each electronic device use differential signal (differential pair) methods such as a Universal Serial Bus (USB), a mobile industry processor interface (MIPI), a low voltage differential signaling (LVDS), and the like to handle high speed processing.

A noise component is generated from the above-described high speed data line due to a signal difference between two lines, and in this case, a common mode filter is used to remove the noise ingredient.

However, in such a high speed data environment, the two lines are disposed along different paths according to disposition on a circuit board, and accordingly, distances between the two lines become different. Accordingly, a time difference between the two lines occurs or impedance is not matched.

Accordingly, when a signal difference between the two lines is removed by the common mode filter, the noise is not effectively removed.

In the common mode filter, particularly, since an impedance difference between the common mode and a differential mode remarkably decreases at a frequency of approximately 2 GHz, a common mode noise block effect decreases and insertion loss of differential mode signal also increases at the same time.

As described above, development of a filter which can have a frequency characteristic which is similar to the common mode even in the differential mode as well as the common mode according to high speed of the data is urgent.

SUMMARY OF THE INVENTION

The present invention is directed to providing a filter for both a differential mode and a common mode which can be used for both the common mode and the differential mode by improving insertion loss of both the common mode and the differential mode.

The present invention provides a filter for both a differential mode and a common mode including a pair of series inductors having a plurality of coil patterns, two pairs of parallel capacitors connected to both ends of each of the pair of inductors, and a pair of series capacitors connected to the pair of inductors in parallel.

The two pairs of parallel capacitors may be formed in a symmetrical structure so as to have the same value.

Both the pair of series capacitors and the two pairs of parallel capacitors may satisfy a formula below.

$$\tfrac{1}{2} \times Cpc < Csc < 2 \times Cpc$$

where, $Cpc$ may be capacitance of each of the two pairs of parallel capacitors, and $Csc$ may be capacitance of each of the pair of series capacitors.

Impedance of each of the pair of series inductors may be greater than or equal to impedance of each of the two pairs of parallel capacitors.

The filter for both a differential mode and a common mode may further include a pair of input electrodes connected to one end of each of the pair of inductors, a pair of output electrodes connected to another end of each of the pair of inductors, and a pair of ground electrodes disposed to be perpendicular to the pair of input electrodes and the pair of output electrodes and disposed to be connected to the two pairs of parallel capacitors.

The present invention provides a filter for both a differential mode and a common mode including at least one inductor part in which a plurality of sheets having a pair of coil patterns and through holes are stacked, wherein the pair of coil patterns are connected through the through holes to form a pair of inductors; a pair of input electrodes connected to one end of each of the pair of inductors; a pair of output electrodes connected to another end of each of the pair of inductors; a pair of ground electrodes disposed to be perpendicular to the pair of input electrodes and the pair of output electrodes; and at least one capacitor part disposed to be stacked on at least one side of the inductor part and in which a plurality of sheets having at least one electrode are stacked. Here, the capacitor part includes at least one first capacitor electrode connected to the pair of ground electrodes, a pair of second capacitor electrodes disposed to face the first capacitor electrode and each connected to the pair of input electrodes, and a pair of third capacitor electrodes disposed to face the first capacitor electrode and each connected to the pair of output electrodes, and a pair of series capacitors are formed between the pair of input electrodes and the pair of output electrodes due to two electrodes facing each other among the second capacitor electrode, the third capacitor electrode, and the coil pattern.

The first capacitor electrode and the pair of second capacitor electrodes, and the first capacitor electrode and the pair of third capacitor electrodes may form two pairs of parallel capacitors.

In the capacitor part, at least a part of one of the second capacitor electrodes and at least a part of one of the third capacitor electrodes may be disposed to face each other.

In the capacitor part, the pair of second capacitor electrodes and the pair of third capacitor electrodes may be disposed between the two first capacitor electrodes.

In the capacitor part, the one first capacitor electrode may be disposed between the pair of second capacitor electrodes and the pair of third capacitor electrodes.

The pair of second capacitor electrodes and the pair of third capacitor electrodes may be disposed on the same sheet to be spaced apart from each other, the one first capacitor electrode may be disposed to face the pair of second capacitor electrodes and the pair of third capacitor electrodes, and the coil pattern of the sheet nearest to the capacitor part among the inductor part may be disposed to face the pair of second capacitor electrodes or the pair of third capacitor electrodes so as to form the pair of series capacitors.

The inductor part may be disposed on or under the capacitor part.

The inductor part may be disposed between two capacitor parts.

The capacitor part may be disposed between two inductor parts.

The first capacitor electrode may have a width greater than those of each of the pair of second capacitor electrodes and the pair of third capacitor electrodes.

Meanwhile, the present invention provides a filter for both a differential mode and a common mode including a pair of input electrodes, a pair of output electrodes provided opposite the pair of input electrodes, a pair of ground electrodes disposed to be perpendicular to the pair of input electrodes and the pair of output electrodes, a pair of inductors connected in series between each of the pair of input electrodes and the pair of output electrodes, two pairs of parallel capacitors connected in parallel between both ends of each of the pair of inductors and the ground electrodes, and a pair of series capacitors connected in parallel with the pair of inductors.

According to the present invention, since a pass band for a differential signal is compensated for by adding a series capacitor to a common mode filter including a π-shaped filter, it is possible to be used for both a common mode and a differential mode.

Further, since the present invention can be used for both the common mode and the differential mode, noises can be removed in an application having a comparatively high data processing speed without using an additional filter.

DETAILED DESCRIPTION OF THE INVENTION

Figure 1:
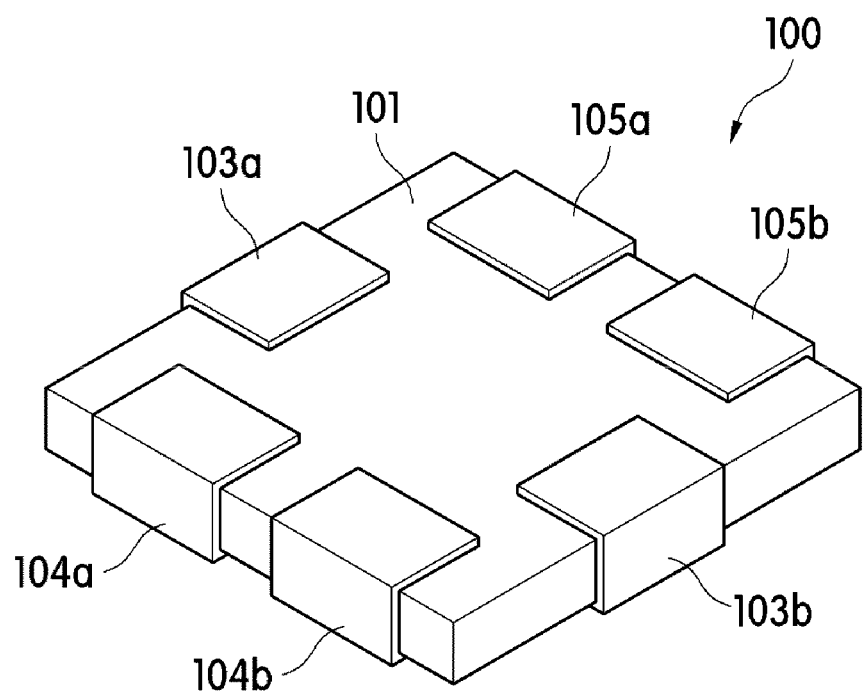
FIG. 1 is a perspective view of a filter for both a differential mode and a common mode according to an embodiment of the present invention.

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are omitted in the drawings to clearly describe the present invention, and the same reference symbols are used for the same or similar components in the description.

A filter for both a differential mode and a common mode 100 according to an embodiment of the present invention includes a plurality of sheet layers 101, ground electrodes 103a and 103b, input electrodes 104a and 104b, output electrodes 105a and 105b, an inductor part 110, and a capacitor part 120.

Figure 2:
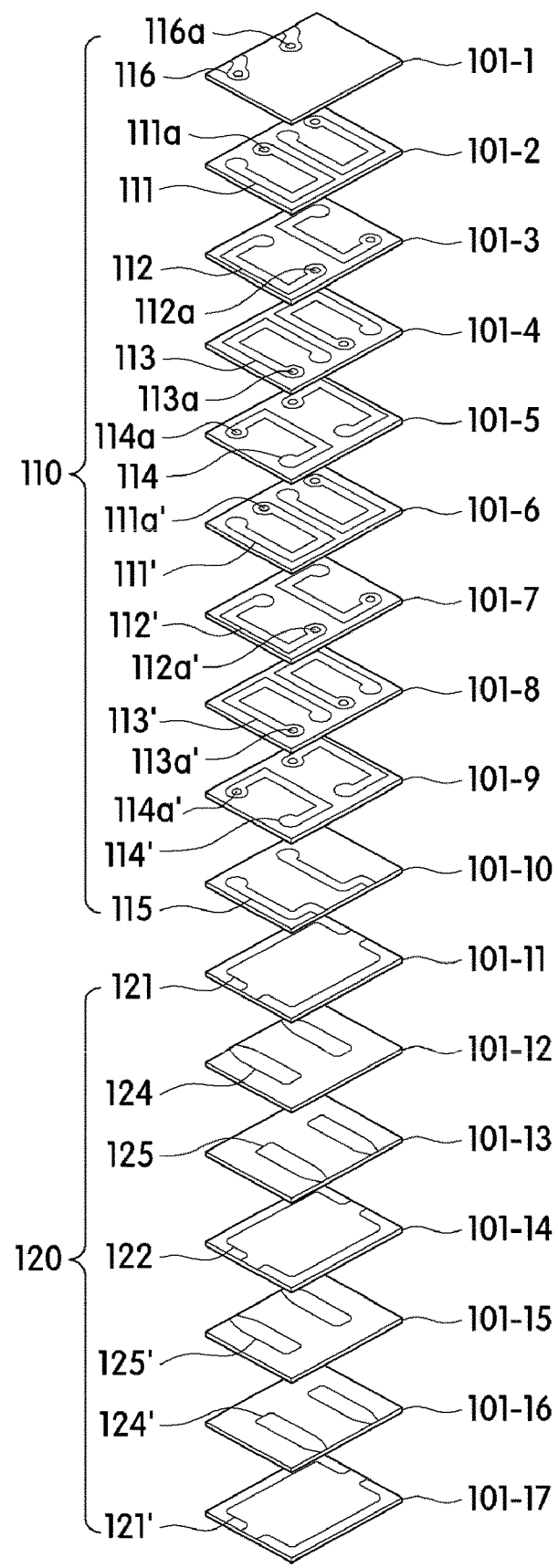
FIG. 2 is a separated perspective view illustrating a stacking relationship of the filter for both a differential mode and a common mode in FIG. 1.

As shown in FIG. 2, the plurality of sheet layers 101 include a plurality of sheets which have patterns and are stacked, and each form the inductor part 110 or the capacitor part 120 according to an electrode or pattern formed on each sheet. Here, the inductor part 110 and the capacitor part 120 form a pair, and each form low pass filters 102a and 102b.

As shown in FIG. 1, the ground electrodes 103a and 103b are disposed to be perpendicular to the pair of input electrodes 104a and 104b and the pair of output electrodes 105a and 105b and form a pair on both sides of each of the plurality of sheet layers 101.

Figure 3:
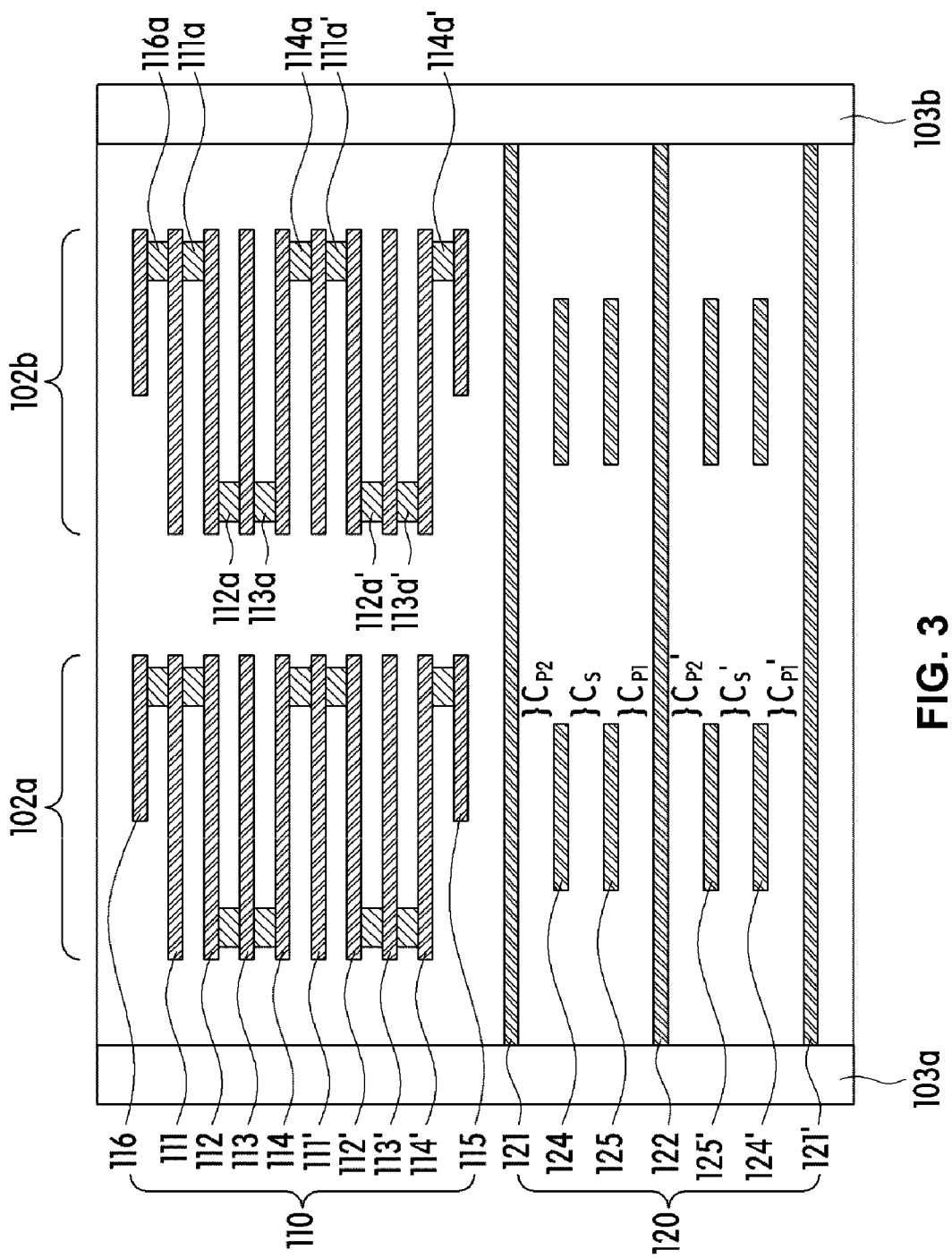
FIG. 3 is a lateral cross-sectional view of the filter for both a differential mode and a common mode in FIG. 1.

As shown in FIG. 3, the ground electrodes 103a and 103b are electrically connected to some electrodes of the capacitor part 120.

The input electrodes 104a and 104b are disposed on one side of each of the plurality of sheet layers 101 and form a pair. A pair of differential signals may be input to the input electrodes 104a and 104b.

The output electrodes 105a and 105b are disposed to face the input electrodes 104a and 104b at each of the plurality of sheet layers 101 and form a pair. A pair of filtered signals may be output to the output electrodes 105a and 105b.

Figure 4:
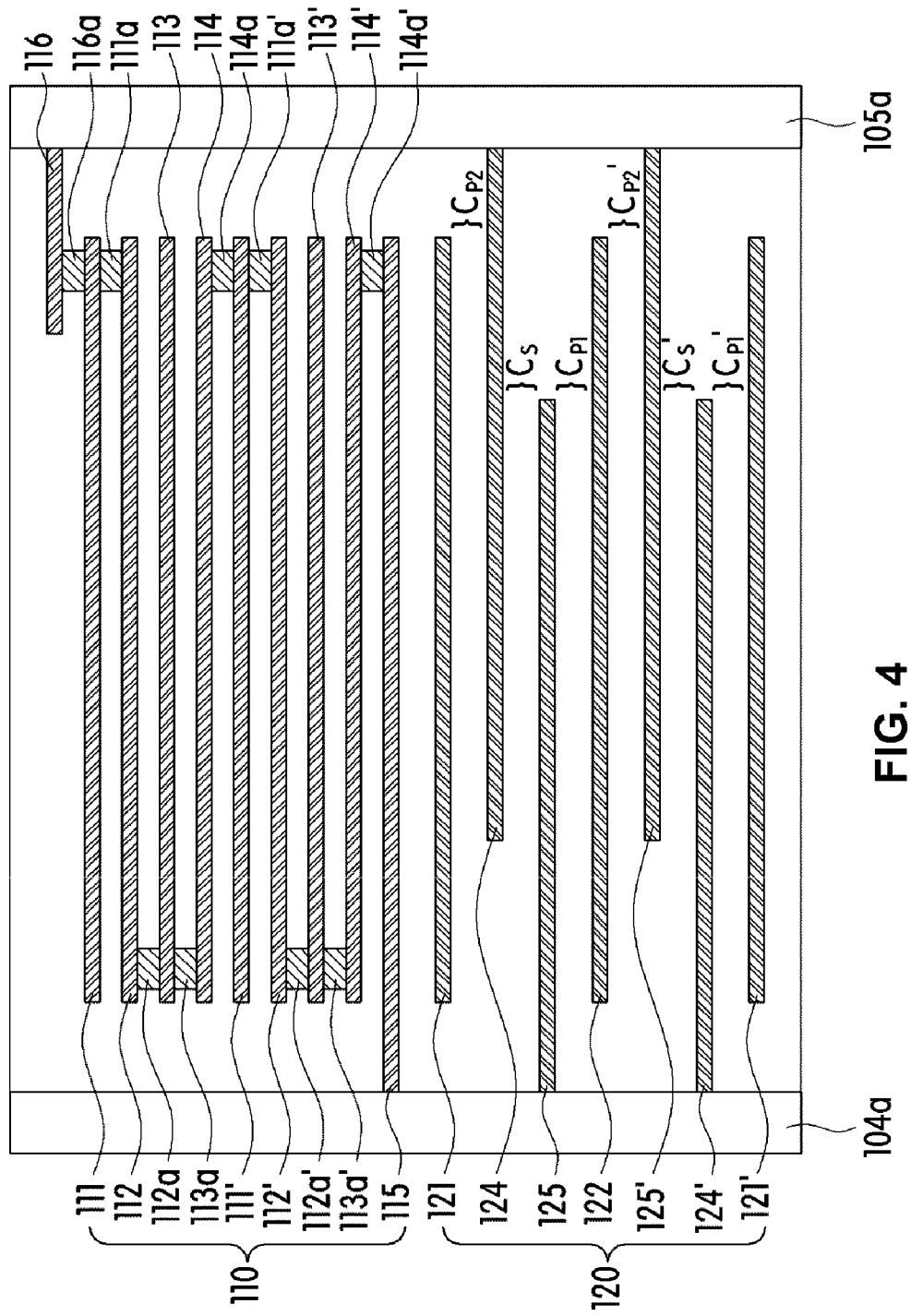
FIG. 4 is a longitudinal cross-sectional view of the filter for both a differential mode and a common mode in FIG. 1.

As described above and as shown in FIG. 4, the input electrodes 104a and 104b and the output electrodes 105a and 105b are electrically connected to both ends of the inductor part 110. That is, the pair of input electrodes 104a and 104b are connected to one end of the inductor part 110, and the pair of output electrodes 105a and 105b are connected to the other end of the inductor part 110.

Here, the input electrodes 104a and 104b and the output electrodes 105a and 105b are just named for convenience of the description and may be reversely used for functions thereof. That is, signals may be input to the output electrodes 105a and 105b, and signals of which noises are removed may be output to the input electrodes 104a and 104b.

The inductor part 110 includes a plurality of sheets 101-1 to 101-10 which are stacked, and each of the sheets includes a pair of coil patterns 111 to 114 and 111' to 114', withdrawal patterns 115 and 116, and through holes 111a to 114a, 111a' to 114a', and 116a. Here, the pair of coil patterns 111 to 114 and 111' to 114' are connected through the through holes 111a to 114a, 111a' to 114a', and 116a of the sheets and forma pair of inductors. The inductor part 110 may be disposed on the capacitor part 120.

In this case, the pair of coil patterns 111 to 114 and 111' to 114' may be wound in different directions. That is, the coil patterns 111 to 114 and 111' to 114' of the first low pass filter 102a, and the coil patterns 111 to 114 and 111' to 114' of the second low pass filter 102b may be wound in the different directions. For example, the coil patterns 111 to 114 and 111' to 114' of the first low pass filter 102a may be wound in a clockwise direction, and the coil patterns 111 to 114 and 111' to 114' of the second low pass filter 102b may be wound in a counterclockwise direction.

As described above, since the pair of coil patterns 111 to 114 and 111' to 114' are disposed in the different directions and thus a phase of current occurs which has a difference of 180°, directions of magnetic fields generated by the coil patterns become opposite each other. Accordingly, since electromagnetic interference (EMI) noises radiated from the coil patterns are offset, radiation to the outside may be blocked.

Further, the withdrawal pattern 115 is provided to connect the inductor and the input electrodes 104a and 104b, and the withdrawal pattern 115 may be provided at the lowest sheet 101-10 in the inductor part 110. In addition, the withdrawal pattern 116 is provided to connect the inductor and the output electrodes 105a and 105b, and the withdrawal pattern 116 may be provided at the highest sheet 101-10 in the inductor part 110.

Here, the number of sheets forming the inductor part 110 is not limited to a particular number and may be determined according to capacity of the inductor formed by the coil patterns. Further, each of the coil patterns provided in the sheets is not limited to the shape shown in FIG. 2 and, for example, may be formed in a loop shape.

The capacitor part 120 includes a plurality of sheets 101-11 to 101-17 which are stacked, and each of the sheets includes at least one of capacitor electrodes 121, 121', 122, 124, 124', and 125'. The capacitor part 120 may be disposed to be stacked under the inductor part 110.

The capacitor part 120 includes first capacitor electrodes 121, 121', and 122, second capacitor electrodes 124 and 124', and third capacitor electrodes 125 and 125'.

The first capacitor electrodes 121, 121', and 122 are connected to the pair of ground electrodes 103a and 103b. Here, the first capacitor electrode 121 may be provided on the sheet 101-11, the first capacitor electrode 122 may be provided on the sheet 101-14, and the first capacitor electrode 121' may be provided on the sheet 101-17.

In this case, the first capacitor electrodes 121, 121', and 122 are connected to the ground electrodes 103a and 103b and serves as a ground, and thus may have widths greater than those of each of the second capacitor electrodes 124 and 124' and the third capacitor electrodes 125 and 125'.

The second capacitor electrodes 124 and 124' each form a pair, are disposed to face the first capacitor electrodes 121 and 121', and are connected to the pair of input electrodes 104a and 104b, respectively. That is, the second capacitor electrode 124 may be provided in pairs on the sheet 101-12 disposed under the sheet 101-11, and the second capacitor electrode 124' may be provided in pairs on the sheet 101-16 disposed on the sheet 101-17.

The third capacitor electrodes 125 and 125' each form a pair, are disposed to face the first capacitor electrode 122, and are connected to the pair of output electrodes 105a and 105b, respectively. That is, the third capacitor electrode 125 may be provided in pairs on the sheet 101-13 disposed on the sheet 101-14, and the third capacitor electrode 125' may be provided in pairs on the sheet 101-15 disposed under the sheet 101-14.

Here, although the first capacitor electrodes 121, 121', and 123 are shown and described as three electrodes, and the second capacitor electrodes 124 and 124', and the third capacitor electrodes 125 and 125' are shown and described to include two pairs, but are not limited thereto, the number of capacitor electrodes may be determined according to capacity of the capacitor formed by the capacitor electrodes. For example, the sheets 101-15 to 101-17 in FIG. 2 may be omitted, and accordingly, the first capacitor electrode 121', the second capacitor electrode 124', and the third capacitor electrode 125' may also be omitted in FIG. 2.

In this case, in the capacitor part 120, the second capacitor electrodes 124 or 124' and the third capacitor electrodes 125 or 125' may be disposed between the two first capacitor electrodes 121 and 122 or 121' and 122.

Accordingly, the one first capacitor electrode 121 and the pair of second capacitor electrodes 124 facing the one first capacitor electrode 121 may form a capacitor $C_{P2}$ connected to one sides of the pair of inductors in parallel, and the other first capacitor electrode 122 and the pair of third capacitor electrodes 125 facing the other first capacitor electrode 122 may form a capacitor $C_{P1}$ connected to the other sides of the pair of inductors in parallel.

Like the above, the one first capacitor electrode 121' and the pair of second capacitor electrodes 124' facing the one first capacitor electrode 121' may form a capacitor $C_{P1}$ connected to one sides of the pair of inductors in parallel, and the other first capacitor electrode 122 and the pair of third capacitor electrodes 125' facing the other first capacitor electrode 122 may form a capacitor $C_{P2}$ connected to the other sides of the pair of inductors in parallel.

In this case, the pair of second capacitor electrodes 124 or 124' and the pair of third capacitor electrodes 125 or 125' are disposed to face each other, and accordingly, a pair of series capacitors $C_S$ may be formed between the pair of input electrodes 104a and 104b and the pair of output electrodes 105a and 105b.

Figure 5:
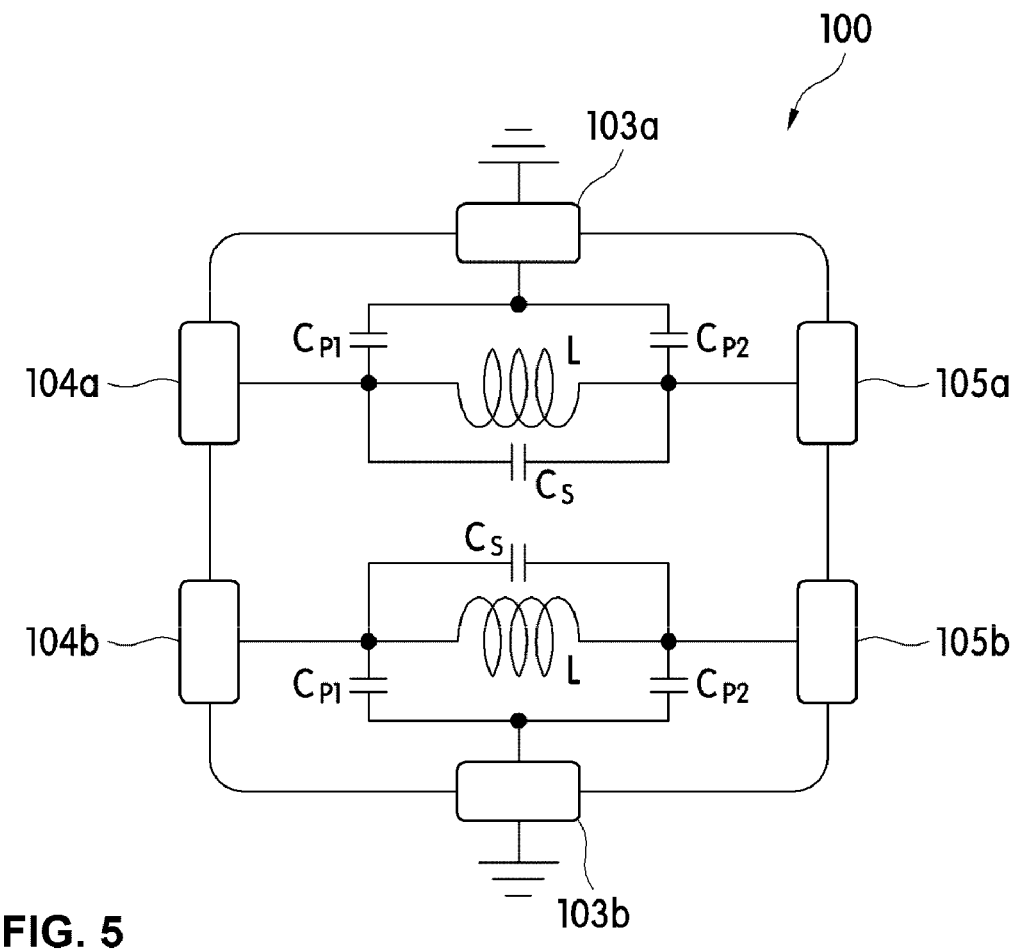
FIG. 5 is an equivalent circuit view of the filter for both a differential mode and a common mode in FIG. 1.

As shown in FIG. 5, the filter for both a differential mode and a common mode 100 includes the two low pass filters 102a and 102b, and each of the two low pass filters 102a and 102b includes a series inductor L, the two parallel capacitors $C_{P1}$ and $C_{P2}$, and the series capacitor $C_S$.

The inductor L includes the plurality of coil patterns 111 to 114 and 111' to 114', and is disposed between the input electrode 104a or 104b and the output electrode 105a or 105b in series.

The parallel capacitor $C_{P1}$ may be disposed between a connection point between the inductor L and the input electrode 104a or 104b, and the ground electrode 103a or 103b in parallel, and the parallel capacitor $C_{P2}$ may be disposed between a connection point between the inductor L and the output electrode 105a or 105b, and the ground electrode 103a or 103b in parallel.

As described above, a π-shaped low pass filter may be formed by the inductor L and the two parallel capacitors $C_{P1}$ and $C_{P2}$.

The series capacitor $C_S$ is disposed between the input electrode 104a or 104b and the output electrode 105a or 105b in series to be disposed in parallel with the inductor L.

Meanwhile, when designing the π-shaped low pass filters 102a and 102b, a fact that ripple ingredients are generated from a pass band when the inductor L has a lower impedance than that of the one parallel capacitor $C_{P1}$ or $C_{P2}$ was known through a simulation.

Accordingly, since the filter for both a differential mode and a common mode 100 according to the embodiment of the present invention includes the series capacitors $C_S$ in parallel with the inductor L to compensate the impedance of the inductor L, the ripple ingredients may be removed.

That is, a frequency characteristic for the differential signal may achieve a sharp inclination characteristic due to the series capacitors $C_S$ like the above. More specifically, although the pass band generally has more ripple ingredients when a cutoff characteristic of filter has a sharper inclination, like the embodiment of the present invention, since the series capacitors $C_S$ are provided between the input electrodes 104a and 104b and the output electrodes 105a and 105b, the ripple ingredients in the pass band mat may be removed even when having the sharp inclination characteristic.

Figure 6:
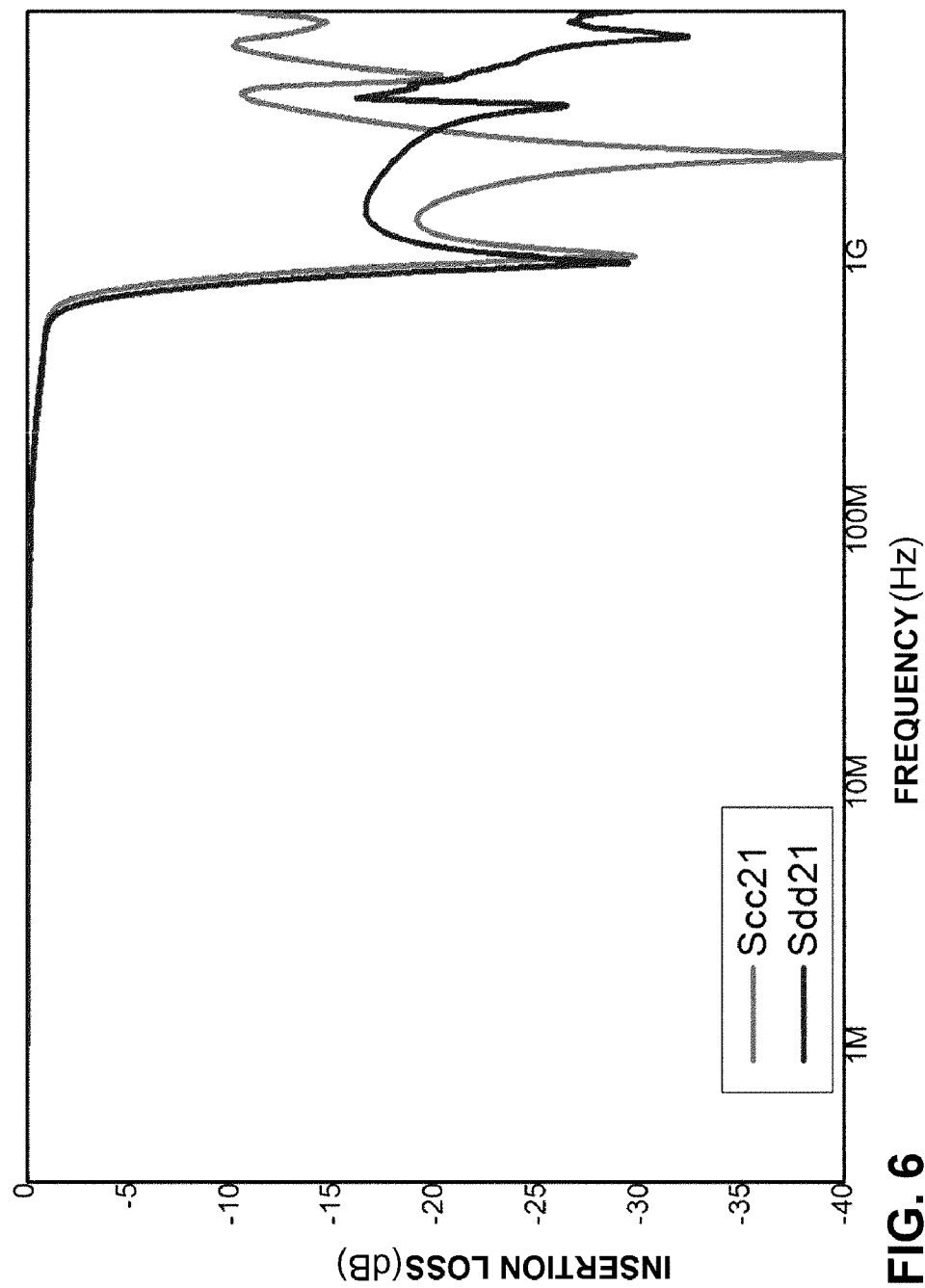
FIG. 6 is a frequency characteristic graph illustrating insertion loss of the filter for both a differential mode and a common mode according to the embodiment of the present invention.
Figure 7:
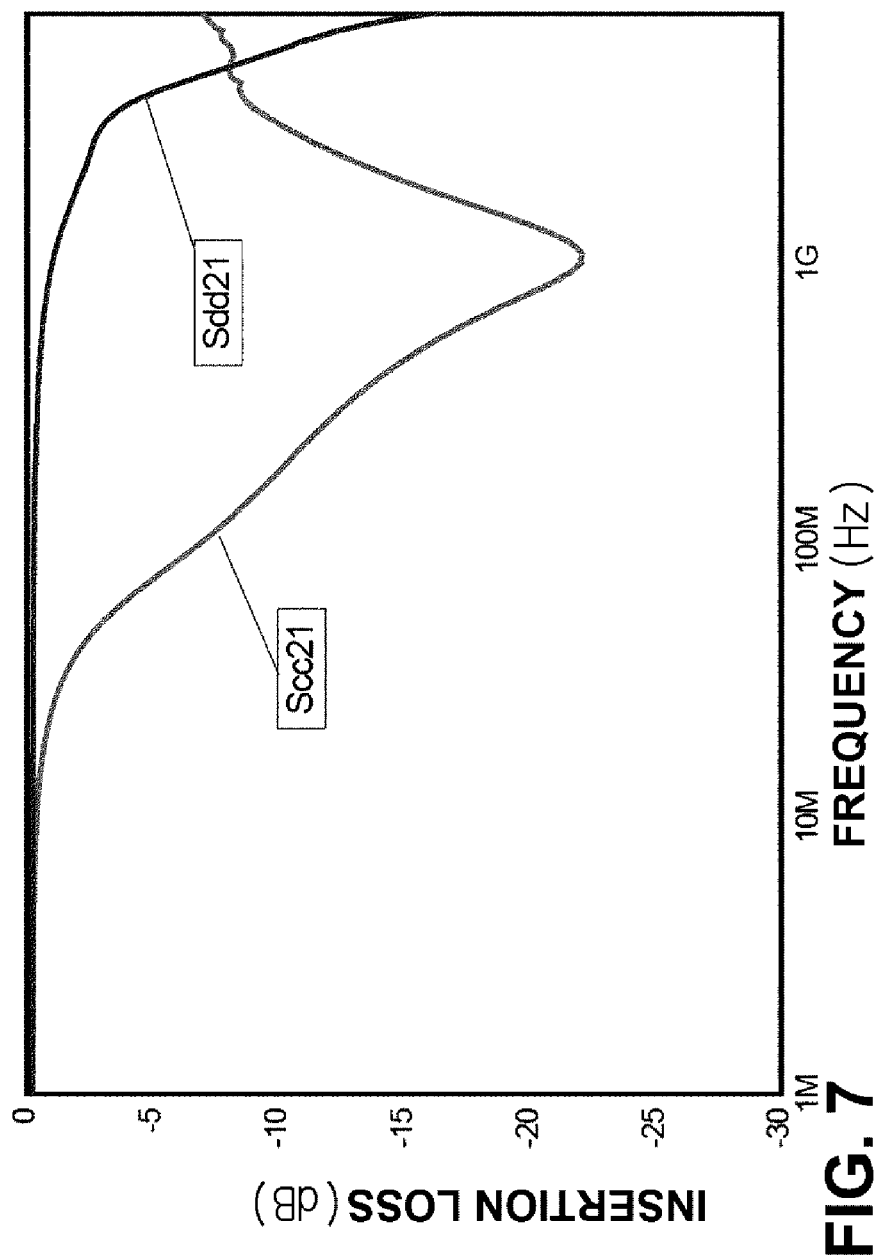
FIG. 7 is a frequency characteristic graph illustrating insertion loss of a conventional common mode filter.

As shown in FIGS. 6 and 7, conventionally, a differential mode Sdd21 and a common mode Scc21 have not only gentle cutoff inclination characteristics as well as different insertion losses, and the flat responses are not secured in a pass band.

However, in the filter for both a differential mode and a common mode 100 according to the embodiment of the present invention, not only insertion losses are similar in both the differential mode and the common mode but also the cutoff inclination characteristics are improved, and the flat responses are secured in the pass band with almost no ripple ingredient.

Further, in the differential mode in which most high speed digital signals are operated, since the signals become fast, and thus a noise frequency area which has to be removed and a signal area which has to pass through are close to each other, an exquisite blocking characteristic of the filter (generally referred to as a skirt characteristic) is being required.

In order to satisfy the characteristics, a fact that a relationship according to the capacities of the series inductors, the parallel capacitors and the series inductors forming the π-shaped low pass filters 102a and 102b has to be properly formed was learned through the simulation.

Figure 8:
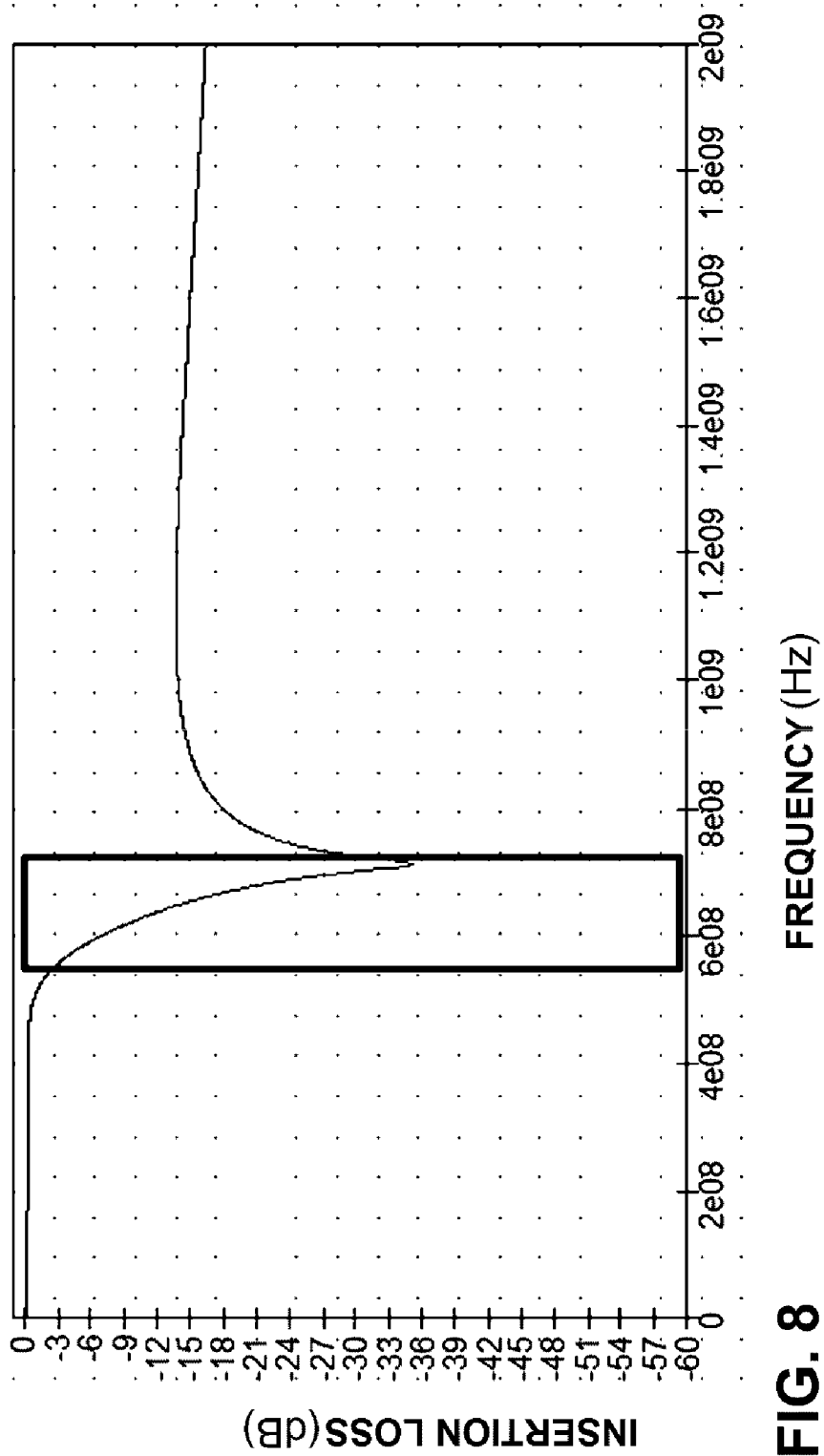
FIGS. 8 and 9 are frequency characteristic graphs illustrating insertion loss for describing a blocking characteristic according to a magnitude relationship between capacitance of a series capacitor and a parallel capacitor in the filter for both a differential mode and a common mode according to the embodiment of the present invention.

Here, as shown in FIG. 8, a superior blocking characteristic may be provided when an inclination of the cutoff is sharply formed in the π-shaped low pass filter.

Figure 9:
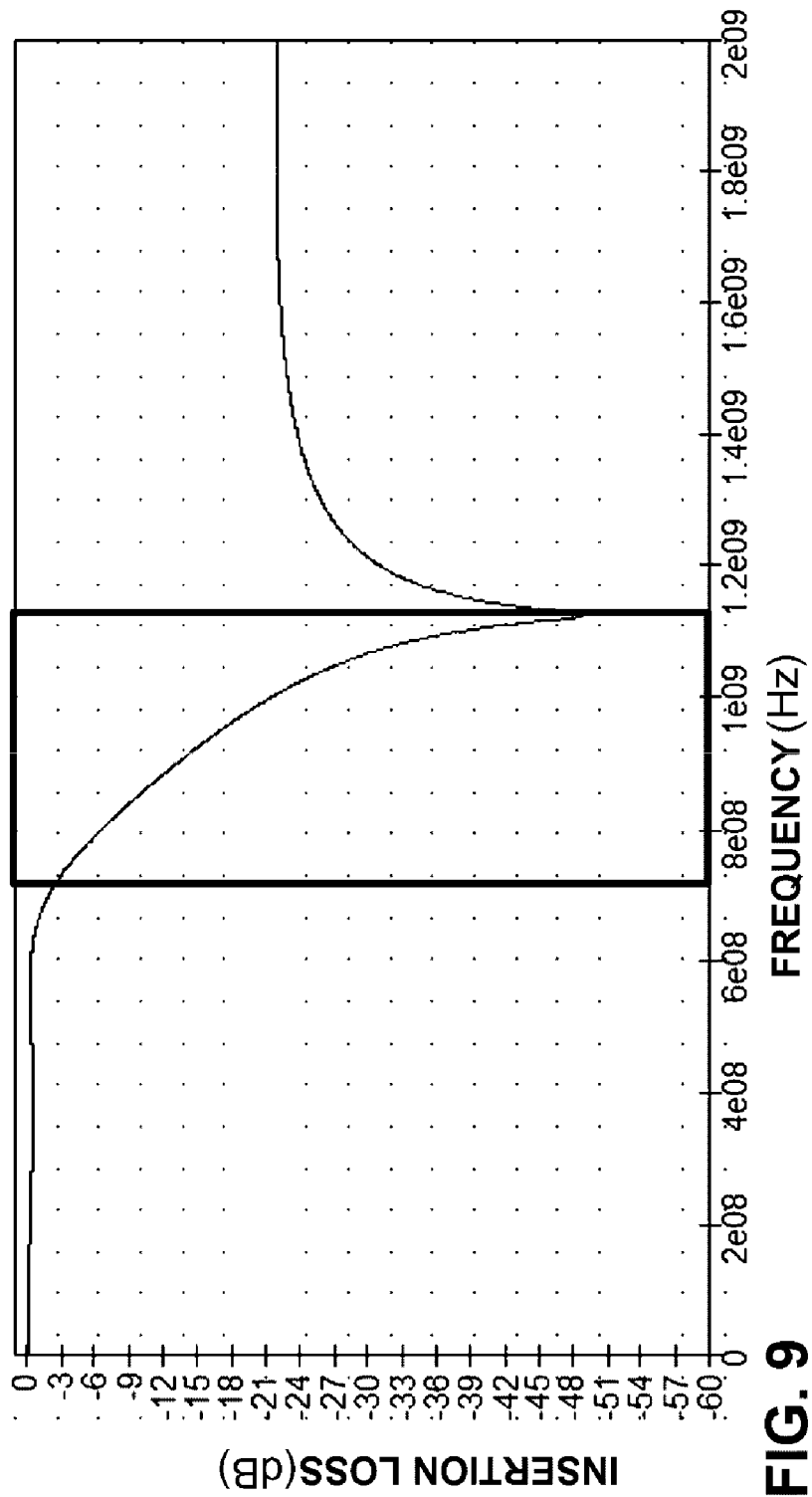

However, when capacitance of the series capacitor $C_S$ is much smaller than capacitance of the parallel capacitors $C_{P1}$ and $C_{P2}$, and particularly, when capacitance $C_S$ of the series capacitor $C_S$ is smaller than half of capacitance CPC of the parallel capacitors $C_{P1}$ and $C_{P2}$, as shown in FIG. 9, since inclination of the cutoff is gently formed, noises of a near frequency may not be properly decreased.

Figure 10:
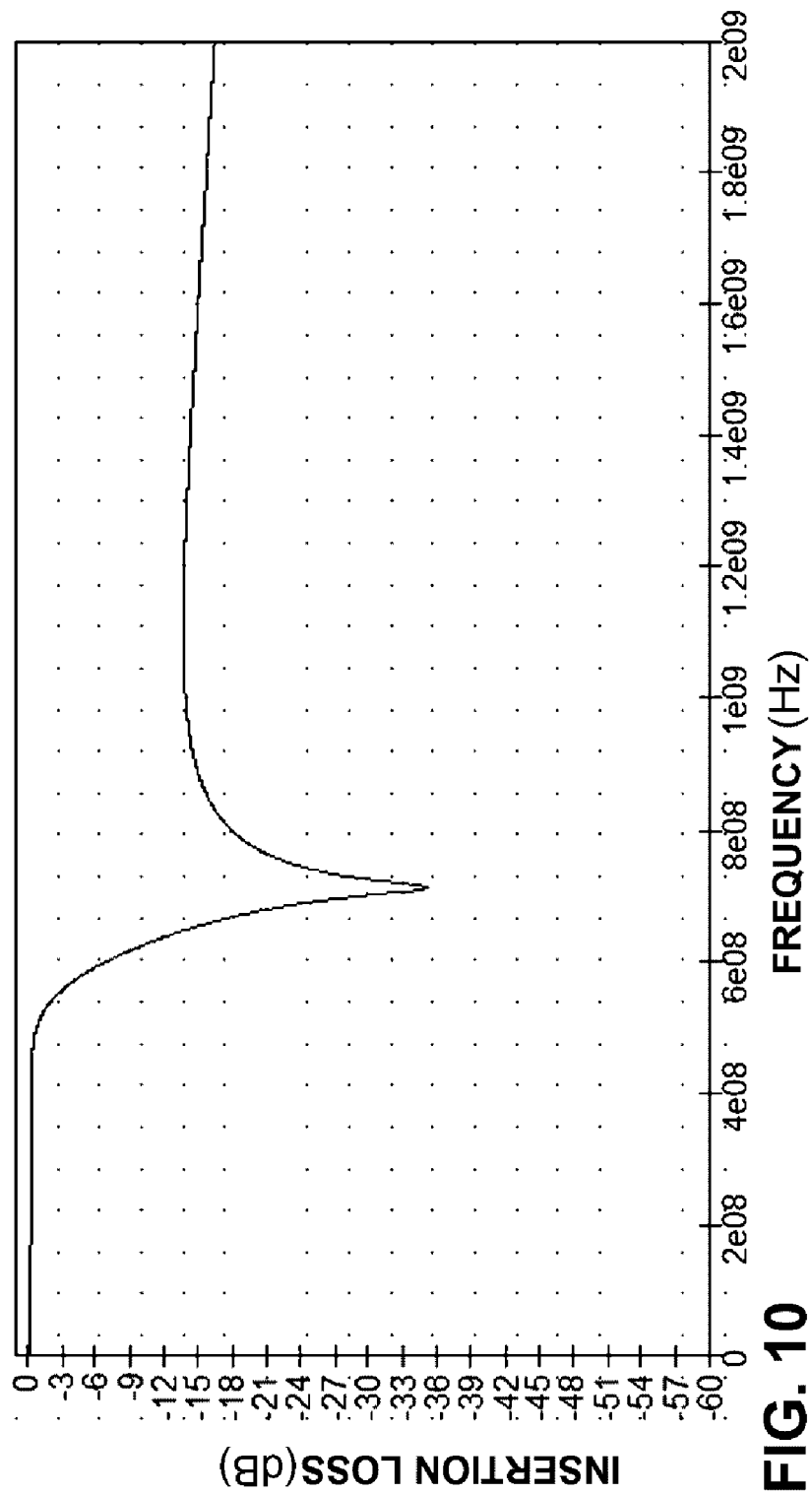
FIGS. 10 and 11 are frequency characteristic graphs illustrating insertion loss for describing an attenuation characteristic according to the magnitude relationship between the capacitance of the series capacitor and the parallel capacitor in the filter for both a differential mode and a common mode according to the embodiment of the present invention.

Further, as shown in FIG. 10, the π-shaped low pass filter may provide a superior attenuation characteristic when having a large overall attenuation value in a noise attenuation band.

Figure 11:
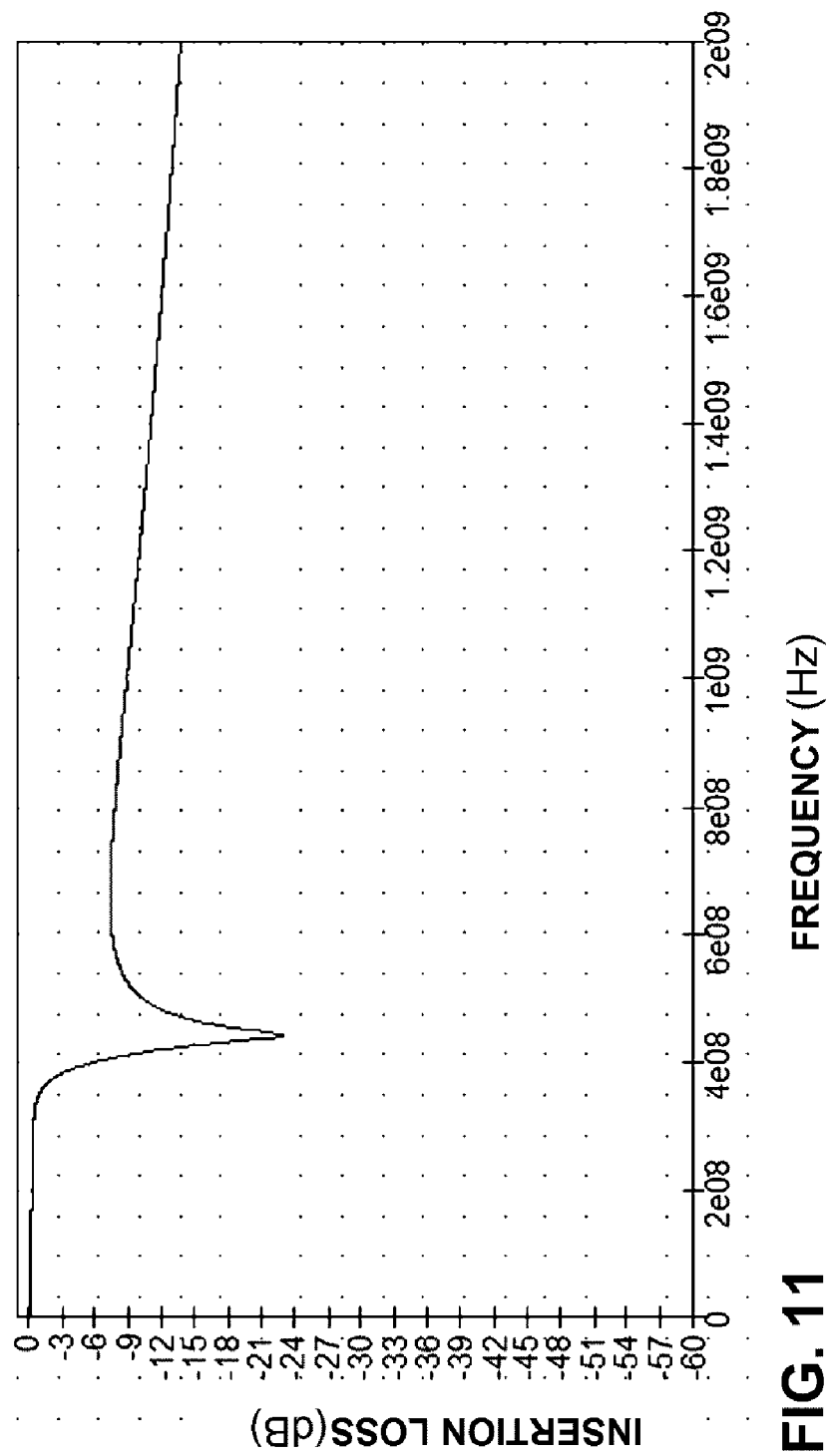

However, when the capacitance of the series capacitor $C_S$ is much greater than the capacitance of the parallel capacitors $C_{P1}$ and $C_{P2}$, and particularly, when the capacitance $C_S$ of the series capacitor $C_S$ is greater than two times of the capacitance $C_{PC}$ of the parallel capacitors $C_{P1}$ and $C_{P2}$, as shown in FIG. 11, the attenuation characteristic is degraded due to a small overall attenuation value in the noise attenuation band.

Accordingly, the series capacitor $C_S$ and the parallel capacitors $C_{P1}$ and $C_{P2}$ preferably satisfy a formula below so that the π-shaped low pass filter achieves both the blocking characteristic and the attenuation characteristic in the differential mode.

$$\tfrac{1}{2} \times Cpc < Csc < 2 \times Cpc$$

Here, Cpc is capacitance of each of the two pairs of parallel capacitors, and Csc is capacitance of each of the pair of series capacitors.

Figure 12:
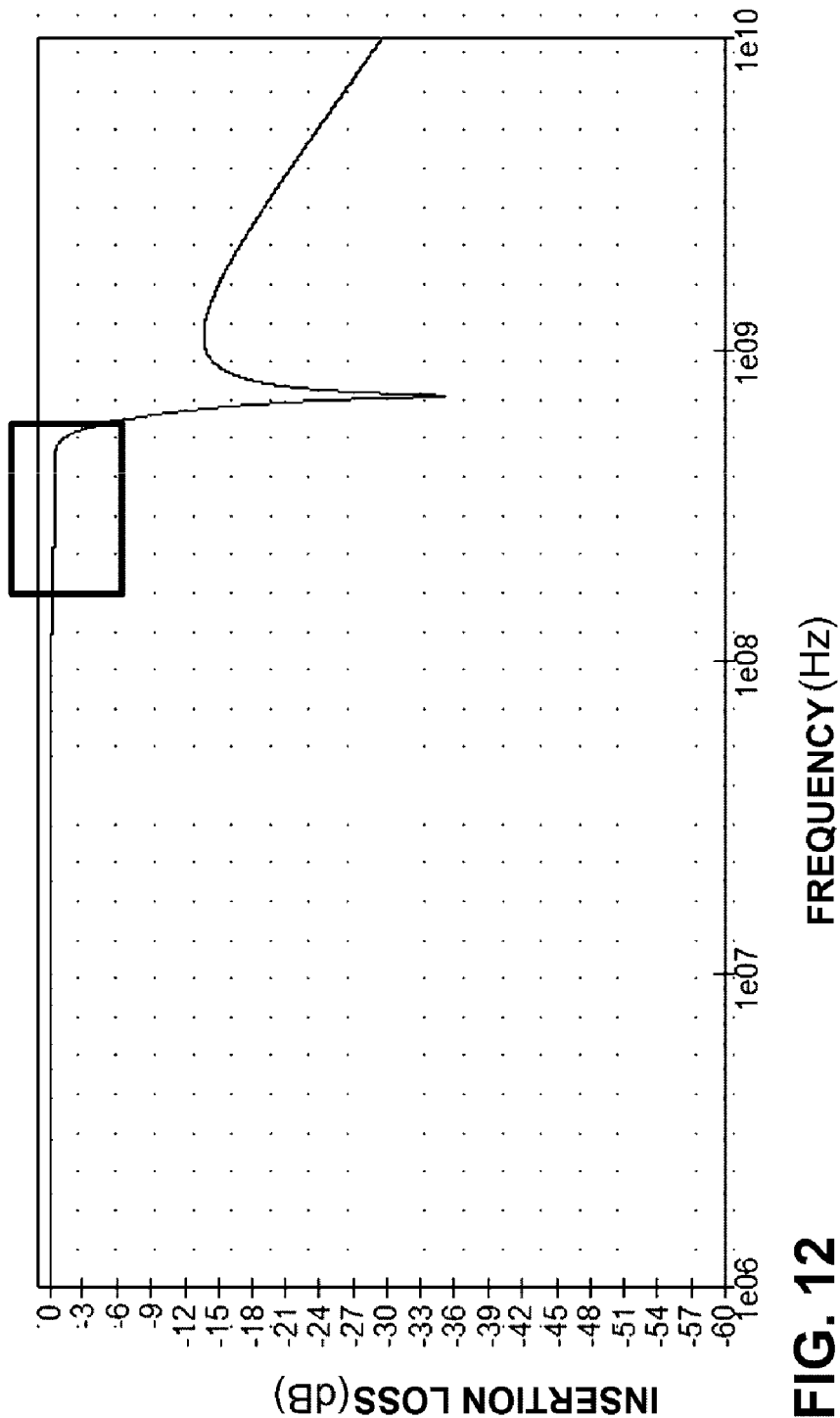
FIGS. 12 and 13 are frequency characteristic graphs illustrating insertion loss for describing a flat response of a pass band according to a magnitude relationship between impedance of the series capacitor and the parallel capacitor in the filter for both a differential mode and a common mode according to the embodiment of the present invention.

Further, as shown in FIG. 12, the π-shaped low pass filter may provide a desired flat response when a ripple is removed from the pass band.

Figure 13:
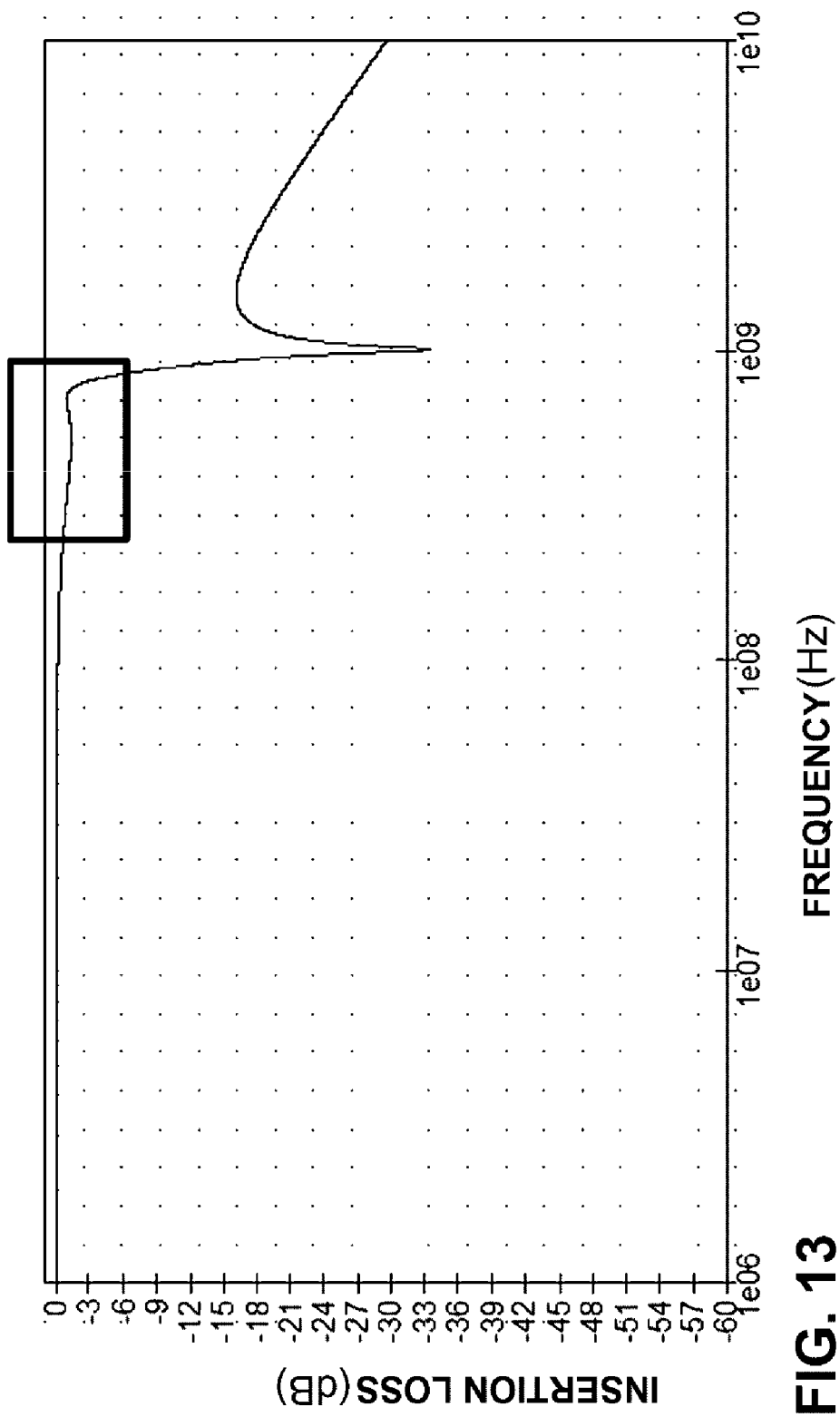

However, when impedance of the series inductor L is smaller than impedance of the parallel capacitors $C_{P1}$ and $C_{P2}$, as shown in FIG. 13, since the ripple is generated from a high frequency area of the pass band, the desired flat response may not be provided, and accordingly, signal loss may be caused.

Accordingly, the impedance of the series inductor L is preferably greater than or equal to the impedance of each of the parallel capacitors $C_{P1}$ and $C_{P2}$ so that the π-shaped low pass filter achieves the flat response in the differential mode.

Further, in a high speed differential circuit, since a direction of input and output signals may be changed, the two parallel capacitors $C_{P1}$ and $C_{P2}$ connected to one inductor L preferably have the same value for designing a filter having a symmetrical structure. That is, the parallel capacitors $C_{P1}$ and $C_{P2}$ may be formed in a symmetrical structure so as to have the same value.

Figure 14:
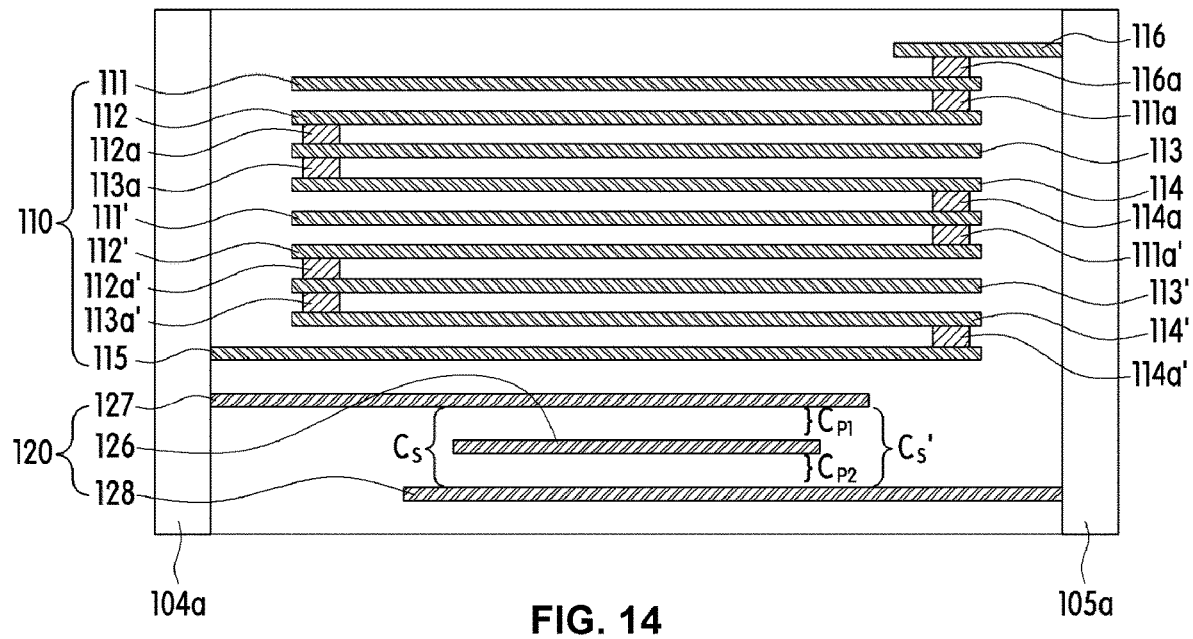
FIGS. 14 and 15 are cross-sectional views illustrating various examples of a capacitor part in the filter for both a differential mode and a common mode in FIG. 1.
Figure 15:
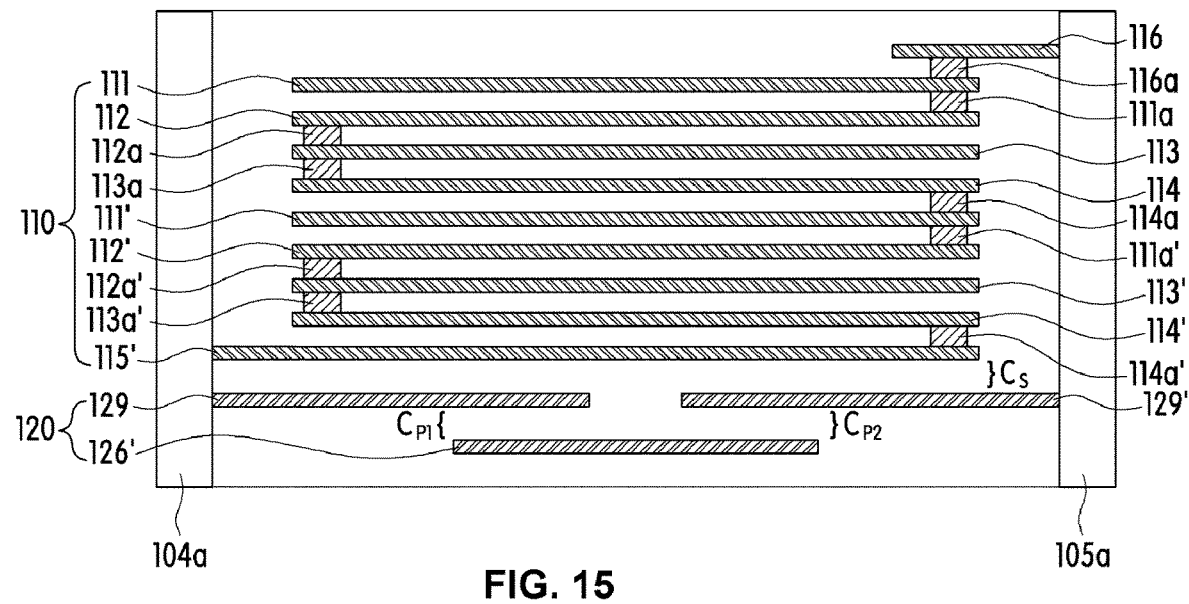

Meanwhile, as shown in FIGS. 14 and 15, in the filter for both a differential mode and a common mode 100 according to the embodiment of the present invention, the capacitor part 120 may be variously configured. Hereinafter, a low pass filter is described on the basis of one of the low pass filters 102a and 120b, and accordingly, it should be apparent that the second capacitor electrode and the third capacitor electrode may be formed in pairs without particular descriptions.

For example, as shown in FIG. 14, one first capacitor electrode 126 may be disposed between a second capacitor electrode 127 and a third capacitor electrode 128 in the capacitor part 120. That is, since the first capacitor electrode 126 and the second capacitor electrode 124 are disposed to face each other, the one parallel capacitor $C_{P1}$ is formed, and since the first capacitor electrode 126 and the third capacitor electrode 128 are disposed to face each other, the other one parallel capacitor $C_{P2}$ is formed.

In this case, at least parts of the second capacitor electrode 127 and the third capacitor electrode 128 may be disposed to face each other. That is, the first capacitor electrode 126 is provided with a length which is smaller than those of the second capacitor electrode 127 and the third capacitor electrode 128 between the input electrode 104a and the output electrode 105a, and the first capacitor electrode 126 is provided at an approximate center portion between the input electrodes 104a and 104b and the output electrodes 105a and 105b.

Accordingly, since the first capacitor electrode 126 is not interposed between the second capacitor electrode 127 and the third capacitor electrode 128 at both areas of the first capacitor electrode 126, and the second capacitor electrode 127 and the third capacitor electrode 128 are disposed to face each other, the series capacitors $C_S$ may be implemented.

As described above, both the parallel capacitors and the series capacitors may be implemented even with only a small number capacitor electrodes as compared with the capacitor part in FIG. 2.

As another example, as shown in FIG. 15, the second capacitor electrode 129 and the third capacitor electrode 129' may be disposed to be spaced apart from each other on the same sheet in the capacitor part 120. Here, the second capacitor electrode 129 may be connected to the input electrode 104a, and the third capacitor electrode 129' may be connected to the output electrode 105a.

In this case, a first capacitor electrode 126' may be disposed to face the second capacitor electrode 129 and the third capacitor electrode 129'. That is, the first capacitor electrode 126' may be disposed under the second capacitor electrode 129 and the third capacitor electrode 129' to face a part of each of the second capacitor electrode 129 and the third capacitor electrode 129'.

Accordingly, since the first capacitor electrode 126' and the second capacitor electrode 129 are disposed to face each other, the one parallel capacitor $C_{P1}$ is formed, and since the first capacitor electrode 121 and the third capacitor electrode 125 are disposed to face each other, the other one parallel capacitor $C_{P2}$ is formed.

Further, the coil pattern of the sheet in the inductor part 110 nearest to the capacitor part 120, that is, a withdrawal pattern 115', may be formed to be elongated to face the third capacitor electrode 125. Accordingly, since the withdrawal pattern 115' is electrically connected to the second capacitor electrode 129, and the withdrawal pattern 115' and the third capacitor electrode 129' are disposed to face each other, the series capacitors $C_S$ are formed.

Here, the first capacitor electrode 126' may be disposed on the first capacitor electrode 129 and the third capacitor electrode 129' when just being disposed opposite the withdrawal pattern 115' on the basis of the second capacitor electrode 129 and the third capacitor electrode 129' is sufficient.

As described above, both the parallel capacitors and the series capacitors may be implemented even with only a small number of sheets which are stacked as compared with the capacitor parts in FIGS. 2 and 14.

Figure 16:
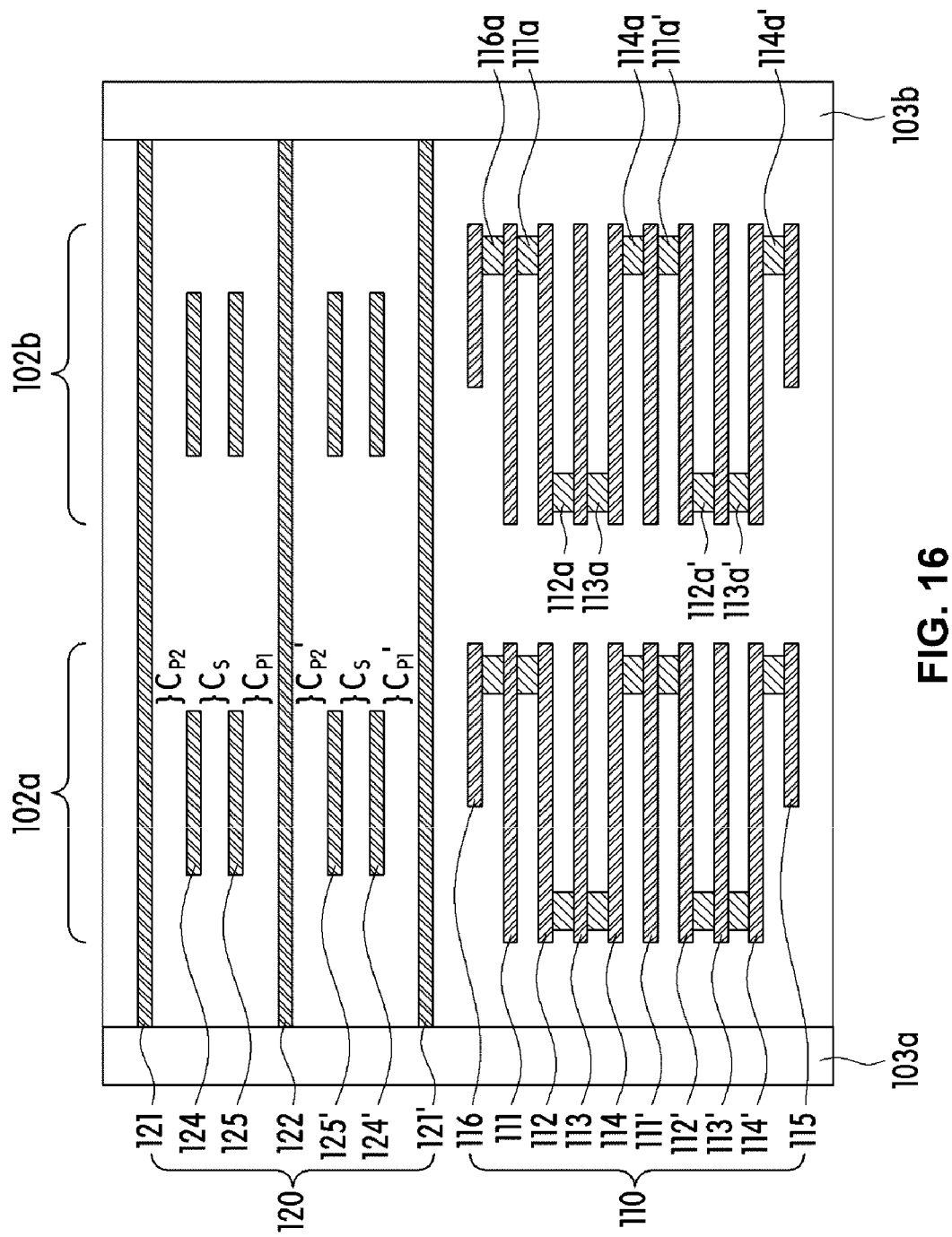
FIGS. 16 to 18 are cross-sectional views illustrating various examples of dispositions of the capacitor part and an inductor part in the filter for both a differential mode and a common mode in FIG. 1.
Figure 17:
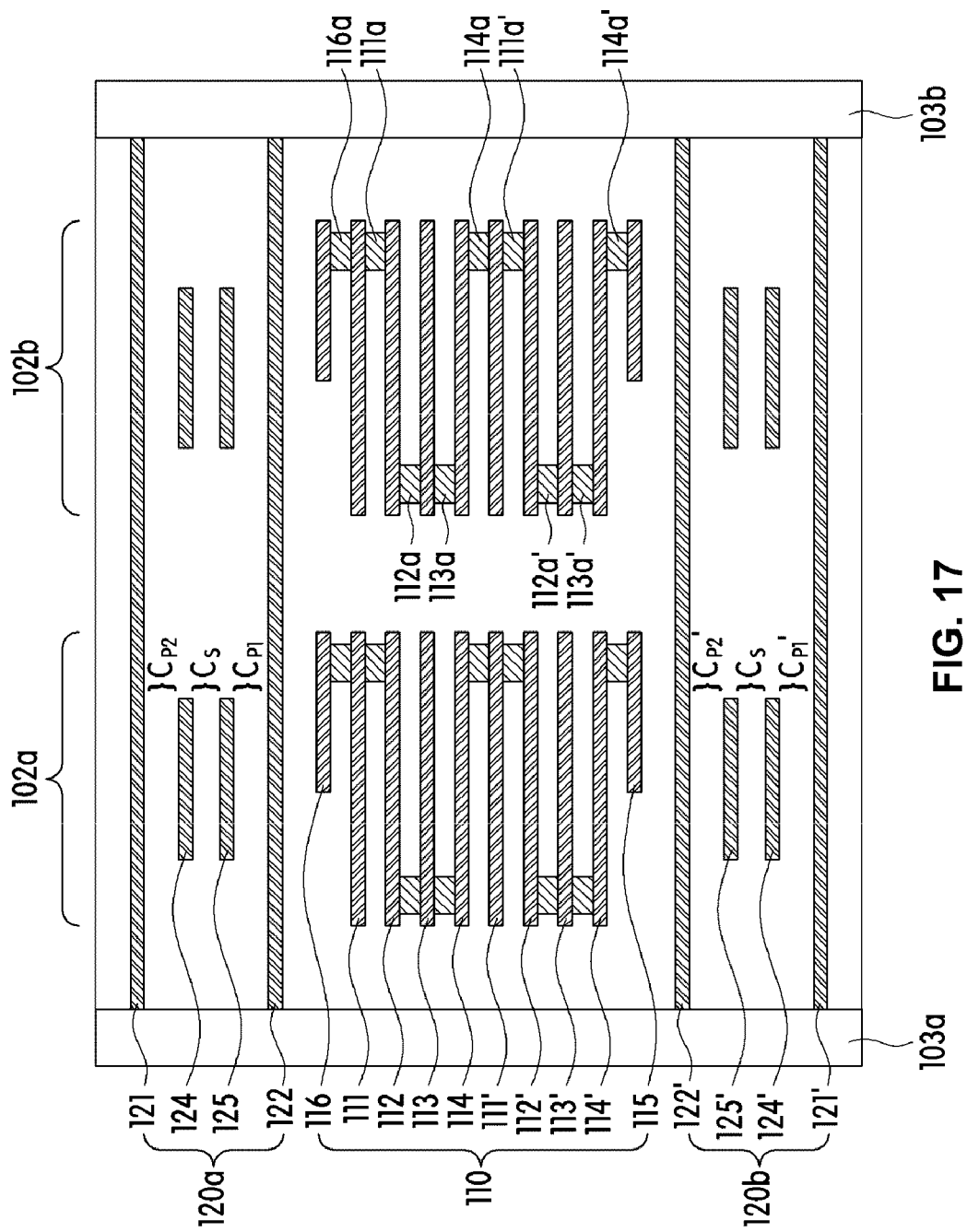
Figure 18:
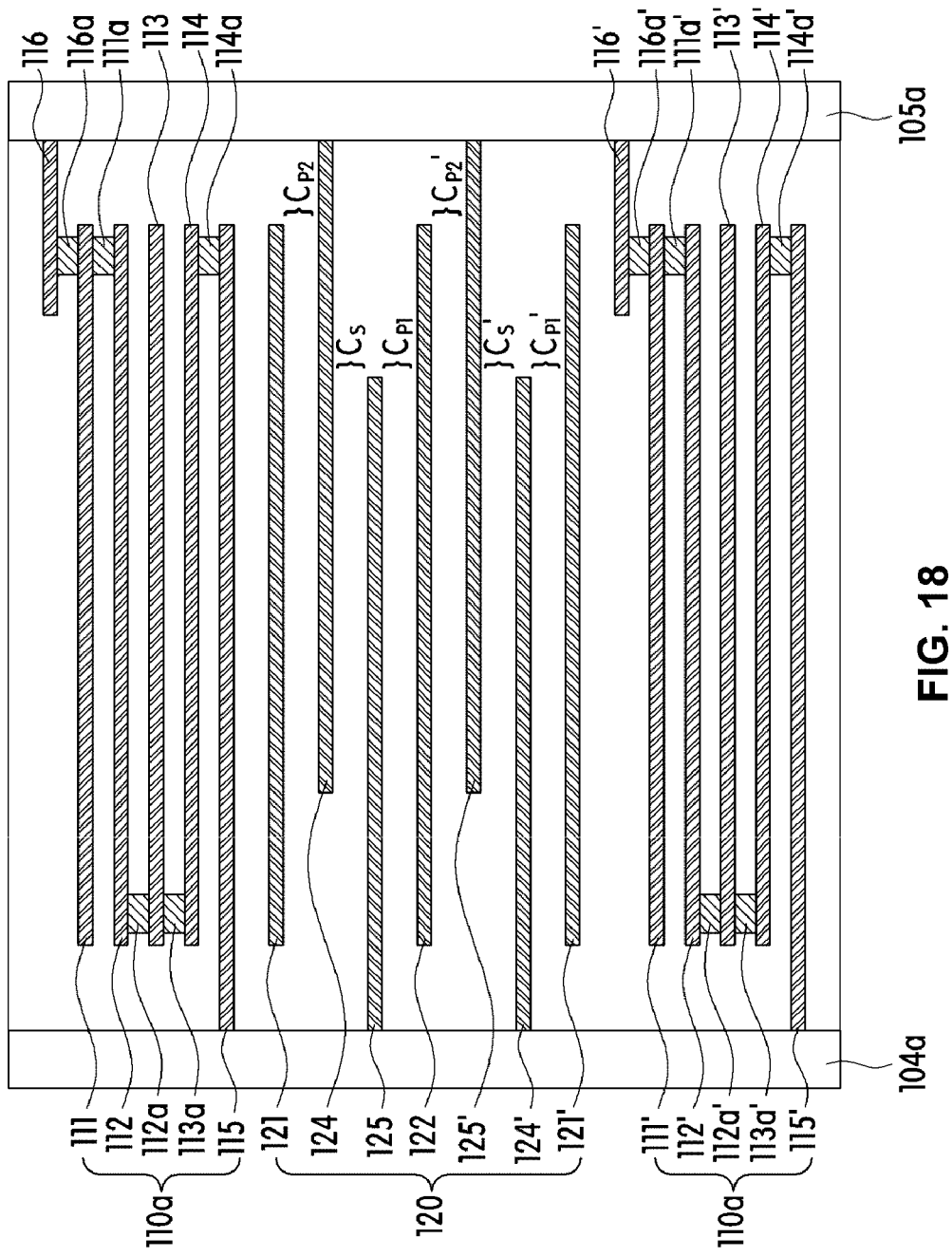

Further, as shown in FIGS. 16 to 18, in the filter for both a differential mode and a common mode 100 according to the embodiment of the present invention, the inductor part 110 and the capacitor part 120 may be variously disposed and stacked.

For example, as shown in FIG. 16, the inductor part 110 may be disposed under the capacitor part 120 in the filter for both a differential mode and a common mode 100. That is, since the sheets 101-1 to 101-10 including the coil patterns 111 to 114 and 111' to 114', the withdrawal patterns 115 and 116 and the through holes 111a to 114a, and 111a' to 114a' are stacked first, and then the sheet 101-11 to 101-17 including the capacitor electrodes 121, 121', 122, 124, 124', and 125' are stacked, the filter for both a differential mode and a common mode 100 may be implemented.

As another example, as shown in FIG. 17, the inductor part 110 may be disposed between the two capacitor parts 120a and 120b in the filter for both a differential mode and a common mode 100. That is, the one capacitor part 120a including the two first capacitor electrodes 121 and 122 connected to the ground electrodes 103a and 103b, respectively, the second capacitor electrode 124 disposed between the two the first capacitor electrodes 121 and 122, and the third capacitor electrode 125 may be disposed on the inductor part 110. Further, the other capacitor part 120b including another two first capacitor electrodes 121' and 122' connected to the ground electrodes 103a and 103b, respectively, the second capacitor electrode 124' disposed between the other two first capacitor electrodes 121' and 122', and the third capacitor electrode 125' may be disposed under the inductor part 110.

As still another example, as shown in FIG. 18, the capacitor part 120 may be disposed between the two inductor parts 110a and 110b in the filter for both a differential mode and a common mode 100. That is, the one inductor part 110a including the withdrawal pattern 115 connected to the input electrode 104a, the withdrawal pattern 116 connected to the output electrode 105a, and the coil patterns 111 to 114 disposed therebetween may be disposed on the capacitor part 120. Further, the other inductor part 110b including the withdrawal pattern 115' connected to the input electrode 104a, the withdrawal pattern 116' connected to the output electrode 105a, and the coil patterns 111' to 114' disposed therebetween may be disposed under the capacitor part 120.

Although one embodiment of the present invention is described above, the spirit of the present invention is not limited to the embodiment shown in the description, and although those skilled in the art may provide other embodiments due to addition, change, or removal of the components within the scope of the same spirit of the present invention, such embodiments and the above embodiments are also included in the scope of the spirit of the present invention.

What is claimed is:

1. A filter for both a differential mode and a common mode, comprising:
   a pair of series inductors having a plurality of coil patterns;
   a pair of parallel capacitors connected to two ends of each of the pair of inductors; and
   a corresponding one of a pair of series capacitors connected in parallel with a corresponding one of the pair of inductors,
   wherein the pair of series capacitors and the pair of parallel capacitors satisfy a formula below, $$\tfrac{1}{2} \times Cpc < Csc < 2 \times Cpc,$$

wherein, Cpc is a capacitance of the pair of parallel capacitors, and Csc is a capacitance of each of the pair of series capacitors.

2. The filter for both a differential mode and a common mode of claim 1, wherein the pair of parallel capacitors are formed in a symmetrical structure so as to have the same value.

3. The filter for both a differential mode and a common mode of claim 1, further comprising:
   a pair of input electrodes connected to one end of each of the pair of inductors;
   a pair of output electrodes connected to another end of each of the pair of inductors; and
   a pair of ground electrodes disposed to be perpendicular to the pair of input electrodes and the pair of output electrodes and connected to the pair of parallel capacitors.

4. A filter for both a differential mode and a common mode, comprising:
   a pair of series inductors having a plurality of coil patterns;
   a pair of parallel capacitors connected to two ends of each of the pair of inductors; and a corresponding one of a pair of series capacitors connected in parallel with a corresponding one of the pair of inductors, wherein an impedance of each series inductor is greater than or equal to the impedance of each of the pairs of parallel capacitors.

5. A filter for both a differential mode and a common mode, comprising:

at least one inductor part in which a plurality of first sheets having a pair of coil patterns and through holes are stacked, wherein the pair of coil patterns are connected through the through holes to form a pair of inductors;

a pair of input electrodes connected to one end of each of the pair of inductors;

a pair of output electrodes connected to another end of each of the pair of inductors;

a pair of ground electrodes disposed to be perpendicular to the pair of input electrodes and the pair of output electrodes; and at least one capacitor part disposed to be stacked on at least one side of the at least one inductor part and in which a plurality of second sheets having at least one electrode are stacked, wherein the at least one capacitor part includes:

at least one first capacitor electrode connected to the pair of ground electrodes;

a pair of second capacitor electrodes disposed to face the at least one first capacitor electrode and each connected to the pair of input electrodes; and a pair of third capacitor electrodes disposed to face the at least one first capacitor electrode and each connected to the pair of output electrodes, and a pair of series capacitors are formed between the pair of input electrodes and the pair of output electrodes due to two electrodes facing each other among the pair of second capacitor electrodes, the pair of third capacitor electrodes, and the pair of coil patterns.

6. The filter for both a differential mode and a common mode of claim 5, wherein the at least one first capacitor electrode has a width greater than a width of each of the pair of second capacitor electrodes and the pair of third capacitor electrodes.

7. The filter for both a differential mode and a common mode of claim 5, wherein the at least one first capacitor electrode and the pair of second capacitor electrodes, and the at least one first capacitor electrode and the pair of third capacitor electrodes form two pairs of parallel capacitors; and the two pairs of parallel capacitors are formed in a symmetrical structure so as to have the same value.

8. The filter for both a differential mode and a common mode of claim 7, wherein both the pair of series capacitors and the two pairs of parallel capacitors satisfy a formula below, $$½ \times Cpc < Csc < 2 \times Cpc$$

wherein, $Cpc$ is a capacitance of each of the two pairs of parallel capacitors, and $Csc$ is a capacitance of each of the pair of series capacitors.

9. The filter for both a differential mode and a common mode of claim 7, wherein an impedance of each of the pair of series inductors is greater than or equal to an impedance of each of the two pairs of parallel capacitors.

10. The filter for both a differential mode and a common mode of claim 5, wherein in the at least one capacitor part, at least a part of one of the pair of second capacitor electrodes and at least a part of one of the pair of third capacitor electrodes are disposed to face each other.

11. The filter for both a differential mode and a common mode of claim 5, wherein the at least one first capacitor electrode includes two or more first capacitor electrodes, and in the at least one capacitor part, the pair of second capacitor electrodes and the pair of third capacitor electrodes are disposed between two first capacitor electrodes facing each other among the two or more first capacitor electrodes.

12. The filter for both a differential mode and a common mode of claim 5, wherein in the at least one capacitor part, the at least one first capacitor electrode is disposed between the pair of second capacitor electrodes and the pair of third capacitor electrodes.

13. The filter for both a differential mode and a common mode of claim 5, wherein:

the pair of second capacitor electrodes and the pair of third capacitor electrodes are disposed on the same sheet to be spaced apart from each other;

the at least one first capacitor electrode is disposed to face the pair of second capacitor electrodes and the pair of third capacitor electrodes; and the coil pattern of the sheet nearest to the at least one capacitor part among the at least one inductor part is disposed to face the pair of second capacitor electrodes or the pair of third capacitor electrodes so as to form the pair of series capacitors.

14. The filter for both a differential mode and a common mode of claim 5, wherein the at least one inductor part is disposed on or under the at least one capacitor part.

15. The filter for both a differential mode and a common mode of claim 5, wherein the at least one capacitor part includes two capacitor parts, and the at least one inductor part is disposed between the two capacitor parts.

16. The filter for both a differential mode and a common mode of claim 5, wherein the at least one inductor part includes two inductor parts, and the at least one capacitor part is disposed between the two inductor parts.

* * * * *